(12) United States Patent
Kusabiraki et al.

(10) Patent No.: US 6,376,970 B1
(45) Date of Patent: Apr. 23, 2002

(54) PIEZOELECTRIC RESONATOR SUPPORTING STRUCTURE AND A PIEZOELECTRIC COMPONENT INCLUDING THE SAME

(75) Inventors: Shigemasa Kusabiraki, Takaoka; Takeshi Yamazaki, Ishikawa-ken; Yuji Kosugi; Takeshi Kubo, both of Toyama, all of (JP)

(73) Assignee: Murata Manufacturing Co., LTD, Kyoto (JP)

( * ) Notice: Subject to any disclaimer, the term of this patent is extended or adjusted under 35 U.S.C. 154(b) by 0 days.

(21) Appl. No.: 09/537,591

(22) Filed: Mar. 28, 2000

(30) Foreign Application Priority Data

Mar. 30, 1999 (JP) ............................................. 11-089562
Sep. 22, 1999 (JP) ............................................. 11-268303

(51) Int. Cl.⁷ .......................... H01L 41/053; H03H 9/10
(52) U.S. Cl. ........................ 310/348; 310/326; 310/365
(58) Field of Search ................................ 310/326, 327, 310/348, 365

(56) References Cited

U.S. PATENT DOCUMENTS

| | | | | |
|---|---|---|---|---|
| 3,527,967 A | * | 9/1970 | Dyer et al. | 310/326 |
| 3,733,590 A | * | 5/1973 | Kaufman | 310/348 |
| 5,808,522 A | * | 9/1998 | Futakuchi et al. | 310/326 |
| 5,889,358 A | * | 3/1999 | Mori et al. | 310/348 |
| 6,016,024 A | * | 1/2000 | Unami et al. | 310/348 |
| 6,049,259 A | * | 4/2000 | Irie | 310/348 |
| 6,274,968 B1 | * | 8/2001 | Wajima et al. | 310/348 |

FOREIGN PATENT DOCUMENTS

| | | | | |
|---|---|---|---|---|
| EP | 0 874 454 | | 10/1998 | H03H/9/05 |
| JP | 11-150153 | * | 2/1999 | 310/348 |

* cited by examiner

Primary Examiner—Thomas M. Dougherty
(74) Attorney, Agent, or Firm—Keating & Bennett, LLP

(57) ABSTRACT

A piezoelectric resonator supporting structure supports a piezoelectric resonator at a supporting member through a connecting member. The piezoelectric resonator is adapted to vibrate in a longitudinal vibration mode. A portion of the fixing member that contacts the piezoelectric resonator is made of a vibration transmission restricting material for restricting transmission of vibration from the piezoelectric resonator to the supporting member through the connecting member.

20 Claims, 14 Drawing Sheets

PIEZOELECTRIC RESONATOR SUPPORTING STRUCTURE AND A PIEZOELECTRIC COMPONENT INCLUDING THE SAME

BACKGROUND OF THE INVENTION

1. Field of the Invention

The present invention relates to a piezoelectric resonator supporting structure and a piezoelectric component including the same, and more particularly to a piezoelectric resonator supporting structure for supporting a piezoelectric resonator on a supporting member, such as a base, via a fixing member.

2. Description of the Related Art

FIG. 21 illustrates an example of a piezoelectric resonator relating to a background of the invention and to which the present invention is applied. FIG. 22 is a plan view showing a state in which insulating films are formed on a substrate of the piezoelectric resonator. The piezoelectric resonator 10 shown in FIG. 21 includes a rectangular parallelopiped substrate 12 which is 4 mm long, 1 mm wide, and 1 mm high. The substrate 12 includes twenty piezoelectric layers 14 that are stacked on each other and formed of, for example, piezoelectric ceramic material. These piezoelectric layers 14 have the same dimensions. As indicated by the arrows in FIG. 21, the piezoelectric layers 14 are polarized in a longitudinal direction of the substrate 12 such that the polarization directions of adjacent piezoelectric layers 14 are opposite to each other. The piezoelectric layers 14 at both ends of the substrate 12 are not polarized.

Internal electrodes 16 are disposed between piezoelectric layers 14 of the substrate 12, extend perpendicular to the longitudinal direction of the substrate 12 and are separated from each other in the longitudinal direction of the substrate 12. The internal electrodes 16 are arranged to cover the entire main surfaces of the piezoelectric layers 14. Therefore, the internal electrodes 16 are exposed at four side surfaces of the substrate 12.

A groove 17 is formed in a center portion, in a widthwise direction of the substrate 12, of one of the side surfaces of the substrate 12. At one of the portions, in the widthwise direction of the substrate 12, of the one side surface of the substrate 12 where the groove 17 is not formed, ends of alternate internal electrodes 16 are disposed so as to be covered with insulating films 18. Ends of other alternate internal electrodes 16 are disposed at the other of the portions, in the widthwise direction of the substrate 12, of the one side surface of the substrate 12 where the groove 17 is not formed.

At the one portion of the one side surface of the substrate 12, an external electrode 22 is disposed on, for example, the insulating films 18 provided on the alternate electrodes 16 so as to be connected to the alternate electrodes 16 provided on the other portion. At the other portion of the one side surface of the substrate 12, an external electrode 24 is disposed on, for example, the insulating films 20 provided on the alternate electrodes 16 so as to be connected to the alternate electrodes 16 provided on the one portion.

In the piezoelectric resonator 10 shown in FIG. 21, the external electrodes 22 and 24 are used as input/output electrodes. Since electric fields are applied between the internal electrodes 16 of adjacent layers when a signal is applied to the external electrodes 22 and 24, the piezoelectric layers 14, excluding those at both ends of the substrate 12, become piezoelectrically active. In this case, electrical fields opposite in direction are applied to the piezoelectric layers 14 of the substrate 12 that are polarized in opposite directions. Therefore, the piezoelectric layers 14 as a whole tend to expand and contract in the same direction. In other words, when alternating current electric fields in the longitudinal direction of the substrate 12 are applied to the individual piezoelectric layers 14 by the internal electrodes 16 and the internal electrodes 16 connected to the external electrodes 22 and 24, so that a driving force that expands and contracts the individual piezoelectric layers 14 is generated thereat, the entire piezoelectric resonator 10 is excited with a fundamental vibration of a longitudinal vibration, with the center portions, in the longitudinal direction of the substrate 12, of the substrate 12 acting as nodes.

A description will now be provided of a conventional piezoelectric component in which the piezoelectric resonator 10 shown in FIG. 21 is mounted via fixing members on a base which defines a supporting member.

FIG. 23 illustrates a state before the piezoelectric resonator of the conventional piezoelectric component is fixed. FIG. 24 illustrates a state after the piezoelectric resonator of the piezoelectric component has been fixed. The piezoelectric component 1 shown in FIGS. 23 and 24 includes a base 2 defining a supporting member. Two pattern electrodes 3 are provided on the base 2. Fixing members 4 made of a urethane-type electrically conductive material, that is, a urethane-type synthetic resin containing 85 wt % of Ag are provided on respective center portions, in the longitudinal direction of the external electrodes 22 and 24, of the external electrodes 22 and 24. The fixing members 4 are bonded to the two pattern electrodes 3 on the base 2 via an electrically conductive paste 5 made of an epoxy-type electrically conductive material, that is, an epoxy-type synthetic resin containing Ag. This causes the external electrodes 22 and 24 of the piezoelectric resonator 10 to be electrically coupled to the respective pattern electrodes 3 on the base 2, through the respective fixing members 4, whereby the piezoelectric resonator 10 is fixed to the base 2 through the fixing members 4.

In this case, the larger dimension W1 of the upper portion of each fixing member 4 of the piezoelectric resonator 10 is in the longitudinal direction thereof, the easier it is for vibration to be transmitted. The dimension W1 is in the range of from 1.0 mm to 1.4 mm.

The relationship between the transmission of vibration and dimension W2 of the lower portion of each fixing member 4 of the piezoelectric resonator 10 in the longitudinal direction thereof is small, but with regard to the strength with which the base 2 and the fixing members 4 are grounded, it is, for example, set equal to or greater than 0.5 mm.

Although the amount of vibration transmitted varies with the hardness of the fixing members 4 and the amount of Ag contained in the fixing members 4, it can be reduced by a certain amount even in a direction of thickness of the fixing members 4 by thickness t1 of the fixing members 4. The larger the value of thickness t1, the smaller the amount of vibration transmitted. The thickness t1 has an upper limit due to the height of the piezoelectric components produced. It is within a range of, for example, from 130 μm to 170 μm.

Although thickness t2 (shown in FIG. 23) prior to bonding with the electrically conductive paste 5 is not directly related to the transmission of vibration, when the electrically conductive paste 5 is thick, the fillet size with respect to the fixing members 4 becomes large, thereby increasing the amount of vibration transmitted. On the other hand, when it is thin, the strength with which the fixing members 4 is grounded is reduced. Therefore, the thickness t2 is in a range of from 35 μm to 55 μm.

The piezoelectric component 1 shown in FIGS. 23 and 24 possess the impedance characteristics and the phase characteristics illustrated in FIG. 25 and the filter characteristics illustrated in FIG. 26.

However, in the above-described conventional piezoelectric component 1, when the dimension W1 of the upper portion of each fixing member 4 is made smaller in order to restrict the transmission of vibration, the dimension W2 of the lower portion of the fixing members 4 inevitably becomes small, so that sufficient supporting strength cannot be obtained. On the other hand, in order to make the dimension W2 of the lower portion of the fixing members 4 equal to or greater than a specification value that is equal to or greater than 0.5 mm, the dimension W1 of the upper portion of the fixing members 4 becomes equal to or greater than 0.9 mm, making it easier for vibration to be transmitted.

In addition, in the above-described conventional piezoelectric component 1, when the thickness t1 of the fixing members 4 is made large in order to restrict the transmission of vibration, the manufactured piezoelectric component 1 becomes taller, so that the goal of making light, thin, short, small piezoelectric components cannot be achieved. Further, there has been an increasing demand for decreasing the maximum height of current products from 1.9 mm to 1.7 mm or 1.5 mm, so that the fixing members 4 are becoming shorter and shorter, making it necessary to investigate ways to reduce the amount of energy transmitted.

Still further, in the above-described conventional piezoelectric component 1 having the above-described structure and dimensions, in order to restrict the transmission of vibration, it is necessary to improve the materials used for the fixing members 4 and the electrically conductive paste 5. An effective lower Young's modulus cannot be obtained due to strength requirements and poor cutting performance during cutting of a piezoelectric resonator or cutting operations carried out using a dicing machine. Still further, since it is clear that vibration is transmitted through Ag fillers in the fixing members 4, the amount of vibration transmitted can be restricted by reducing the amount of Ag. However, since, in order to ensure electrical conduction, current electrically conductive pastes are based on urethane-type synthetic resin, the amount of Ag contained cannot be reduced to an amount that is 80 wt % or less.

SUMMARY OF THE INVENTION

To overcome the above described problems, preferred embodiments of the present invention provide a piezoelectric resonator supporting structure which can restrict the amount of vibration transmitted from a piezoelectric resonator to a supporting member while maintaining the strength with which the piezoelectric resonator is held by the supporting member; and a piezoelectric component including the same.

One preferred embodiment of the present invention provides a piezoelectric resonator supporting structure for supporting a piezoelectric resonator on a supporting member via a fixing member, the piezoelectric resonator being adapted to be vibrate in a longitudinal vibration mode, wherein at least a portion of the fixing member that contacts the piezoelectric resonator is made of a vibration transmission restricting material for restricting transmission of vibration from the piezoelectric resonator to the supporting member through the fixing member.

In such a piezoelectric resonator supporting structure of this preferred embodiment of the present invention, the portion of the fixing member that contacts the piezoelectric resonator may correspond to, for example, an outside portion or an inside portion of the fixing member.

In such a piezoelectric resonator supporting structure, a portion of the fixing member which extends from the portion of the fixing member that contacts the piezoelectric resonator to a portion of a portion of the fixing member at the supporting member side may be formed of the vibration transmission restricting material.

In such a piezoelectric resonator supporting structure, the vibration transmission restricting material may include urethane or silicone.

Another preferred embodiment of the present invention provides a piezoelectric component including any one of the above-described piezoelectric resonator supporting structures, wherein the supporting member is a base and a cover is provided on the base so as to cover the piezoelectric resonator.

In such a piezoelectric component, a plurality of the piezoelectric resonators may be provided.

In such piezoelectric resonator supporting structures and piezoelectric components including the same, a portion of the fixing member that contacts the piezoelectric resonator is formed of a vibration transmission restricting material, making it possible to restrict the transmission of vibration from the piezoelectric resonator to the supporting member while maintaining the strength with which the piezoelectric resonator is held by the supporting member.

Other features and advantages of the present invention will become apparent from the following description of the invention which refers to the accompanying drawings.

DETAILED DESCRIPTION OF PREFERRED EMBODIMENTS

Figure 1:
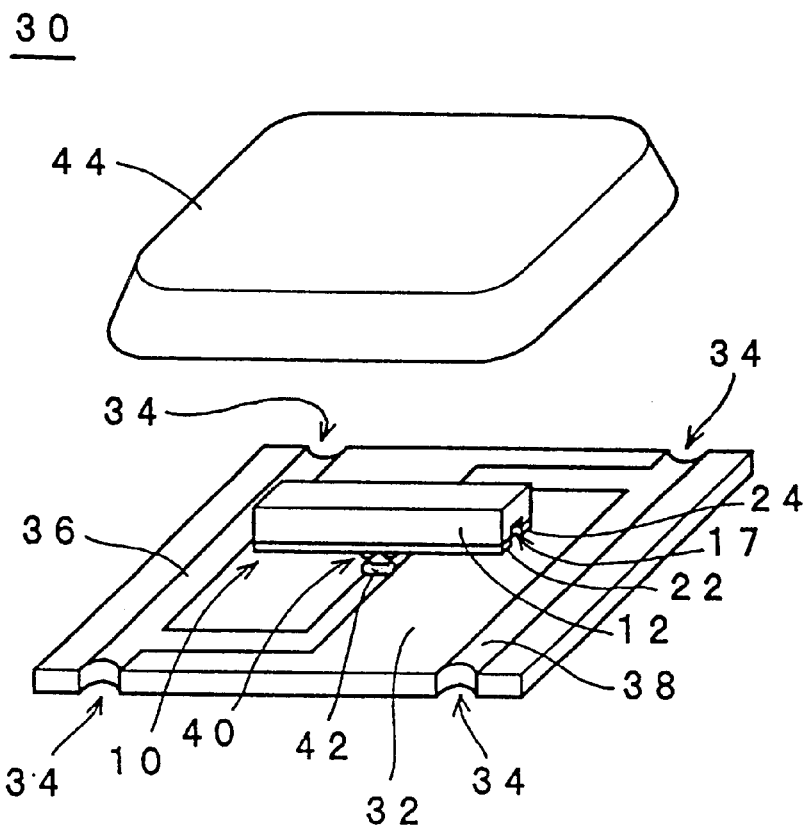
FIG. 1 is an exploded perspective view of a piezoelectric component in accordance with a preferred embodiment of the present invention.
Figure 2:
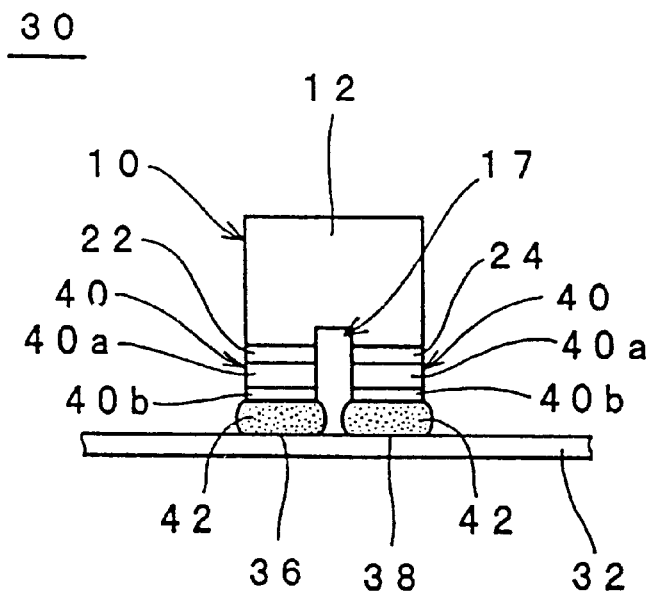
FIG. 2 is a front view of the main portion of the piezoelectric component of FIG. 1.
Figure 3:
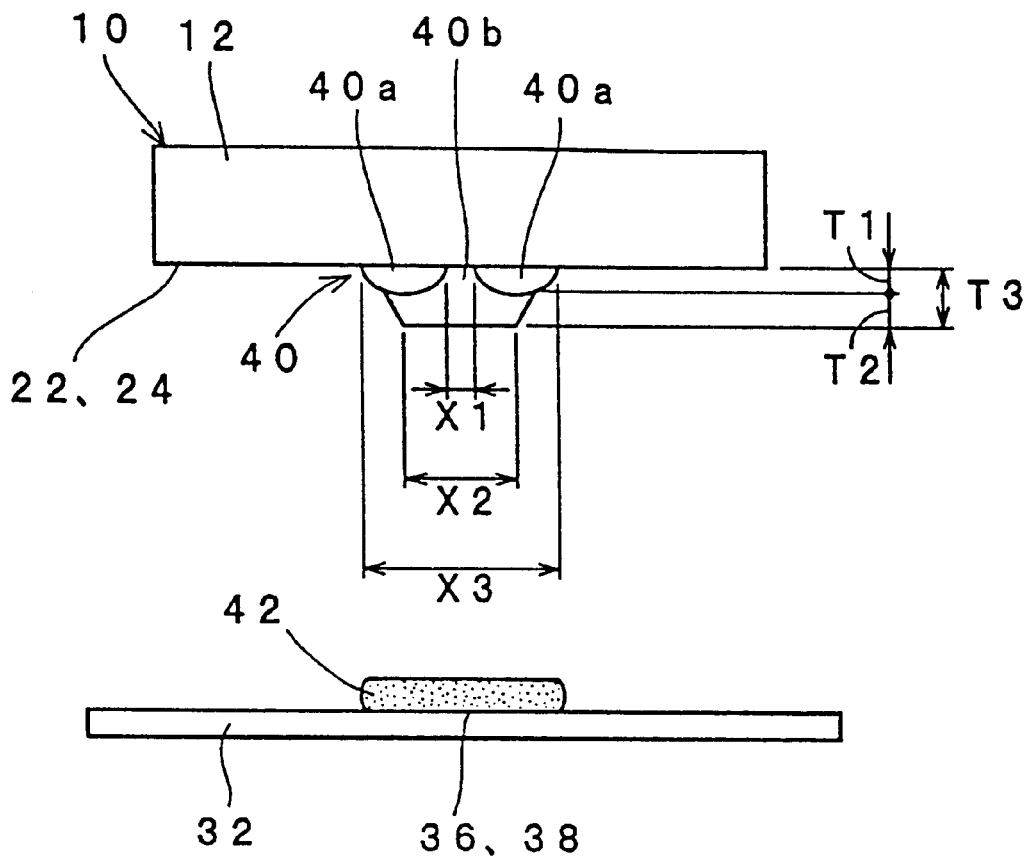
FIG. 3 shows a state before the piezoelectric resonator of the piezoelectric component of FIG. 1 is fixed.
Figure 4:
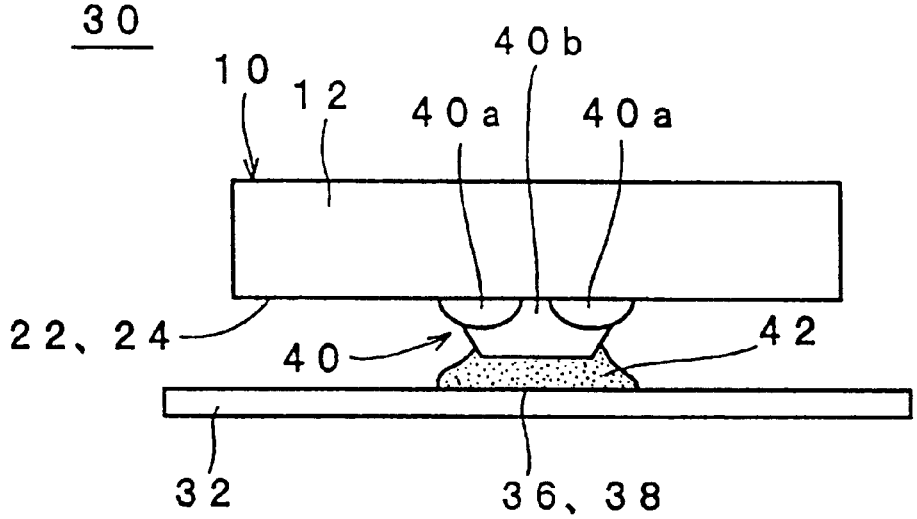
FIG. 4 shows a state after the piezoelectric resonator of the piezoelectric component of FIG. 1 has been fixed.

FIG. 1 is an exploded perspective view of a piezoelectric component in accordance with a preferred embodiment of the present invention. FIG. 2 is a front view of the main portion of the piezoelectric component. FIG. 3 illustrates a state before the piezoelectric resonator of the piezoelectric component is fixed. FIG. 4 illustrates a state after the piezoelectric resonator of the piezoelectric component has been fixed.

The piezoelectric component 30 shown in FIG. 1 includes a base 32 defining a supporting member. Two recesses 34 each are preferably formed on opposite edges of the base 32. Two pattern electrodes 36 and 38 are provided on one surface of the base 32. The pattern electrode 36 is disposed between the one set of two opposing recesses 34, with a substantially L-shaped portion extending from one end side of the pattern electrode 36 to the approximate center portion of the base 32. The pattern electrode 38 is disposed between the other set of two opposing recesses 34, with a substantially L-shaped portion extending from an opposite one end side of the pattern electrode 38 to the approximate center portion of the base 32. The pattern electrodes 36 and 38 are arranged so as to wind around from the recesses 34 in the base 32 and towards the other surface.

Figure 21:
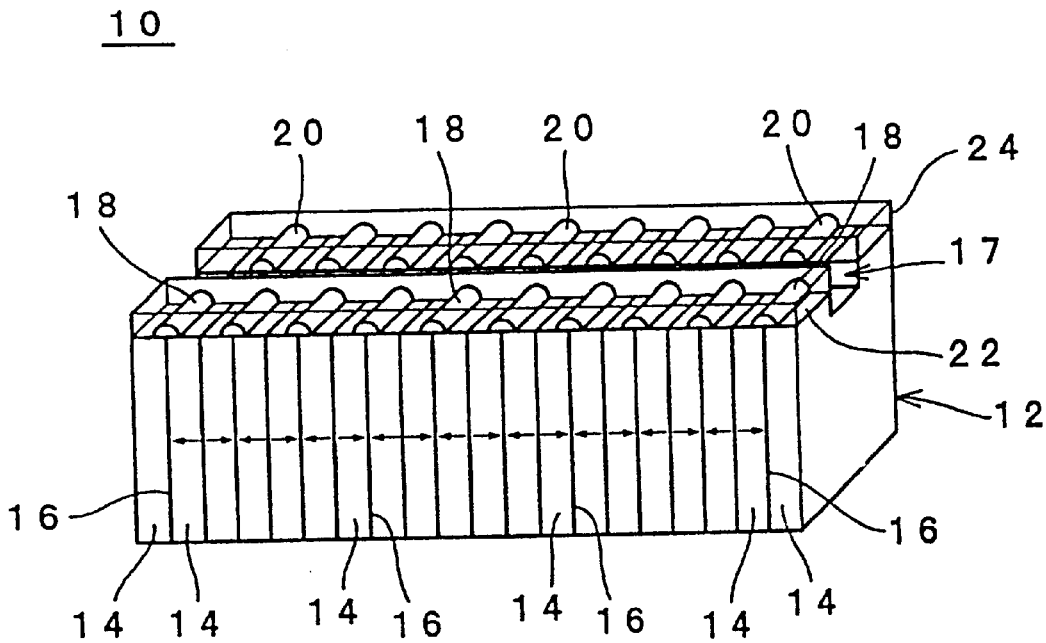
FIG. 21 shows an example of a piezoelectric resonator to which the present invention is applied and serving as background of the present invention.
Figure 22:
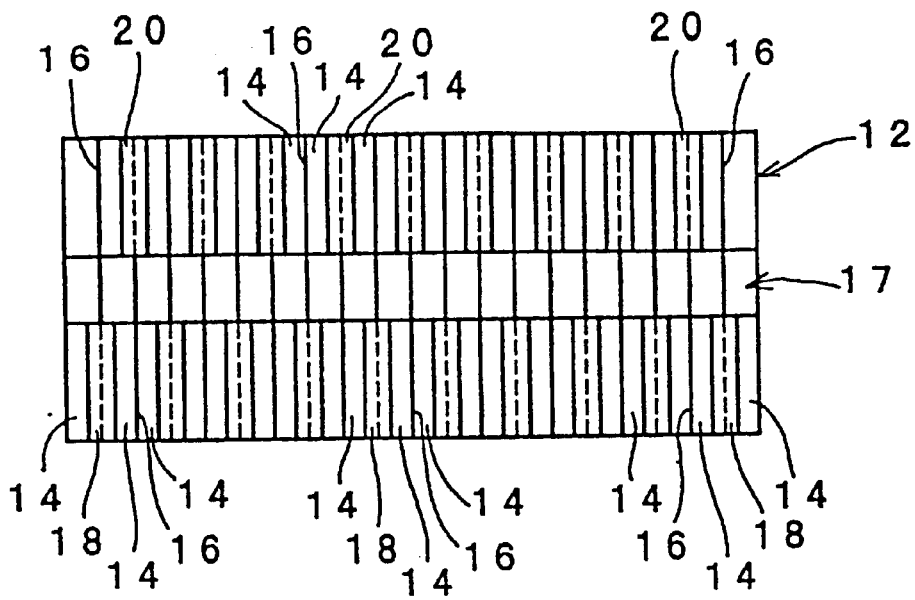
FIG. 22 is a plan view showing a state in which insulating films are provided on a base used in the piezoelectric resonator shown in FIG. 21.

The piezoelectric resonator 10 shown in FIG. 21 is fixed at the approximate center portion of the base 32 through fixing members 40. Here, the two fixing members 40 are preferably located on approximate center portions, in the longitudinal direction of the two external electrodes 22 and 24, of the two external electrodes 22 and 24 of the piezoelectric resonator 10.

Outside portions 40a of one of the fixing members 40 that are portions which contact the external electrode 22 and that extend in a longitudinal direction of the piezoelectric resonator 10 are made of a vibration transmission restricting material, such as urethane or silicone, in order to restrict the transmission of vibrations from the piezoelectric resonator 10 to the base 32 via this fixing member 40. Other portions 40b on both the outside portions 40a of this fixing member 40 are preferably made of a urethane-type electrically conductive material, that is, a urethane-type synthetic resin containing about 85 wt % of Ag. Possible urethane-type electrically conductive materials that can be used are not limited to urethane-type synthetic resin containing about 85 wt % of Ag, so that urethane-type synthetic resin containing, for example, from about 80 wt % to not more than about 85 wt % of Ag may also be used.

Similarly, both outside portions 40a of the other fixing member 40 that are portions that contact the external electrode 24 and are arranged to extend in the longitudinal direction of the piezoelectric resonator 10 are preferably made of a vibration transmission restricting material, such as urethane or silicone, in order to restrict the transmission of vibration from the piezoelectric resonator 10 to the base 32 through this fixing member 40. Other portions 40b on both the outside portions 40a are formed of a urethane-type electrically conductive material, that is, a urethane-type synthetic resin preferably including about 85 wt % of Ag.

Here, although the dimension X1 between the outside portions 40a of each of the fixing members 40 in the longitudinal direction of the piezoelectric resonator 10 is, for example, between about 0.3 mm to about 0.5 mm (which is about 7.5% to about 12.5% of the length of the piezoelectric resonator 10), it is, for example, equal to or less than about 1.0 mm (which is equal to or less than about 25% of the length of the piezoelectric resonator 10). The dimension X1 may also have other values. The lower limit of the dimension X1 is determined from the electrical conductivity between the external electrodes 22 and 24 and the pattern electrodes 36 and 38.

The dimension X2 of the lower portion of each fixing member 40 in the longitudinal direction of the piezoelectric resonator 10 is, for example, equal to or greater than about 0.5 mm, but may have other values.

The dimension X3 of the upper portion of each fixing member 40 in the longitudinal direction of the piezoelectric resonator 10 is preferably, for example, equal to or less than about 1.5 mm, depending on the type of mounting jig used. Considering the dimension X2, it is preferably equal to or greater than about 0.8 mm (which is equal to or greater than about 20% of the length of the piezoelectric resonator 10). The dimension X3 may have other values.

The thickness T1 of the outside portions 40a of each fixing member 40 is, for example, about 20 μm, but may have other values.

The difference T2 between the thickness of the other portions 40b on the outside portions 40a of each fixing member 40 and the thickness of the outside portions 40a of each fixing member 40 is equal to or greater than about 0 mm.

The thickness T3 of each fixing member 40 is, for example, about 200 μm, but may have other values.

The two fixing members 40 are preferably bonded to the two pattern electrodes 36 and 38 on the base 32 with respective electrically conductive pastes 42 preferably made of an epoxy-type electrically conductive material, that is, an epoxy-type synthetic resin containing Ag. This causes the external electrodes 22 and 24 of the piezoelectric resonator 10 to be electrically coupled to the two pattern electrodes 36 and 38 on the base 32 through the fixing members 40, whereby the piezoelectric resonator 10 is mounted on the base 32 through the fixing members 40.

A metallic cap 44 defining a cover is placed over the piezoelectric resonator 10 so as to be disposed on the base 32. In this case, an insulating material, such as insulating resin, is coated on the base 32 and the pattern electrodes 36 and 38 so that electrical conduction does not occur between the metallic cap 44 and the pattern electrodes 36 and 38. By covering the piezoelectric resonator 10 with the metallic cap 44, the electrical component 30, including, for example, a piezoelectric resonator or a piezoelectric discriminator, is produced. In the piezoelectric component 30, the pattern electrodes 36 and 38, arranged so as to extend from the recesses 34 on the base 32 and around it towards the back surface, define input/output terminals for connection to an external circuit.

In the piezoelectric component 30 of FIG. 1, the outside portions 40a of each fixing member 40 being portions of the portions thereof that contact the piezoelectric resonator 10 are preferably made of a vibration transmission restricting material, making it possible to restrict the transmission of vibration from the piezoelectric resonator 10 to the base 32 while maintaining the strength with which the piezoelectric resonator 10 is held by the base 32.

Figure 5:
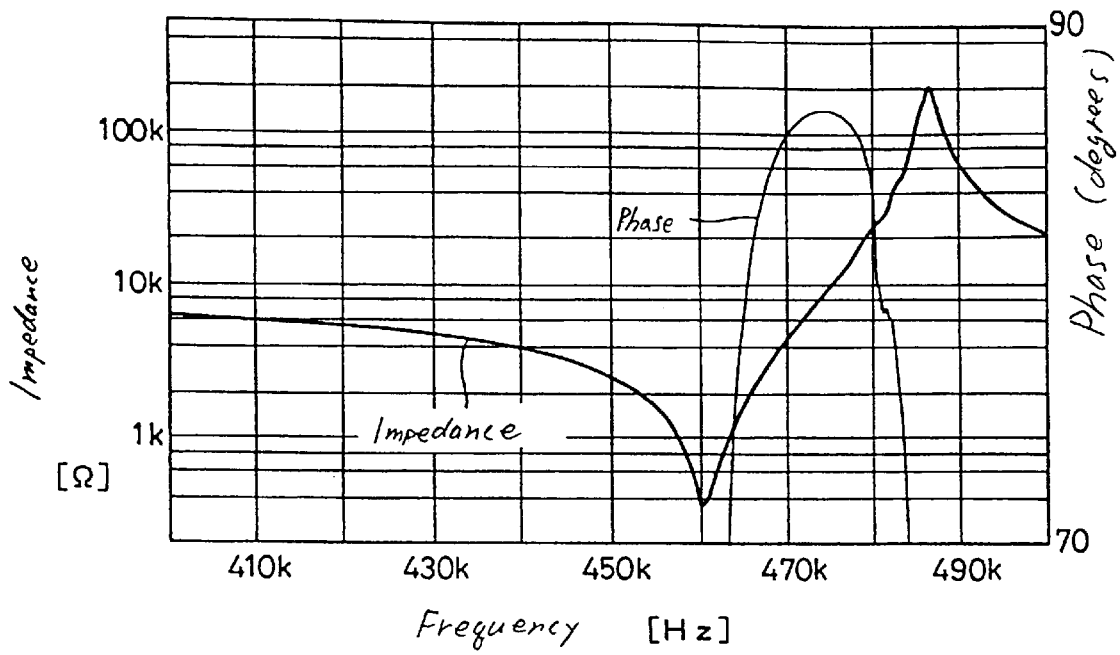
FIG. 5 shows a graph illustrating the impedance characteristics and the phase characteristics of the piezoelectric component of FIG. 1.
Figure 6:
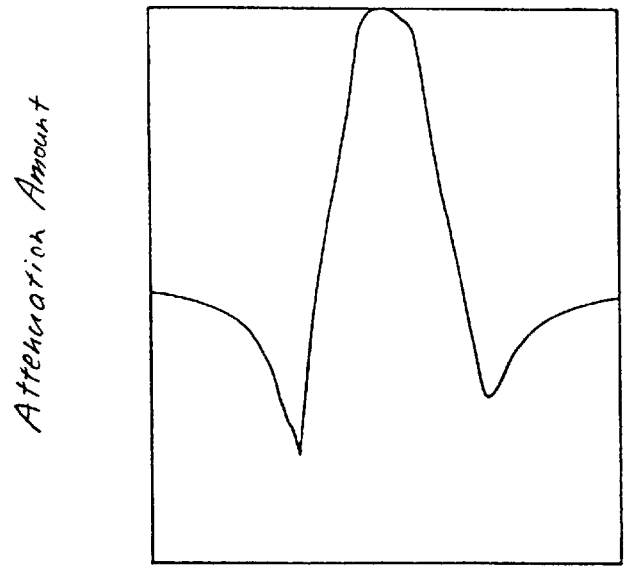
FIG. 6 shows a graph illustrating the filter characteristics of the piezoelectric component of FIG. 1.

The piezoelectric component 30 shown in FIG. 1 possesses the impedance characteristics and the phase characteristics illustrated in FIG. 5, and the filter characteristics illustrated in FIG. 6. From the impedance characteristics and the phase characteristics shown in FIG. 5, it can be seen that the amount of noise produced by the piezoelectric component 30 shown in FIG. 1 is much smaller than that produced by the piezoelectric component 1 shown in FIGS. 23 and 24.

Figure 23:
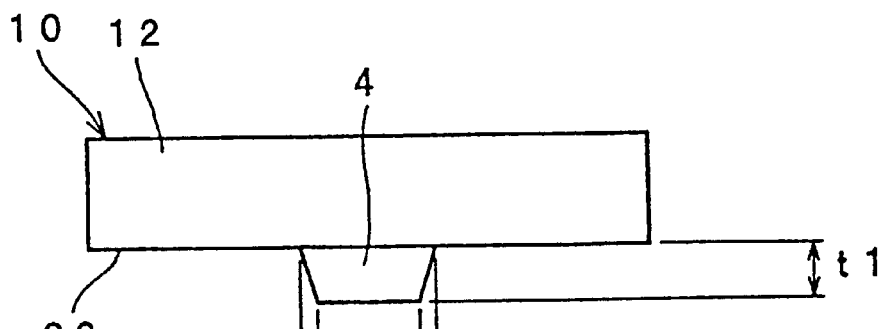
FIG. 23 shows a state before the piezoelectric resonator of a conventional piezoelectric component is fixed.
Figure 23:
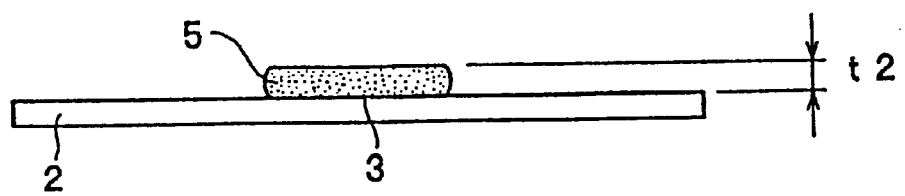
Figure 24:
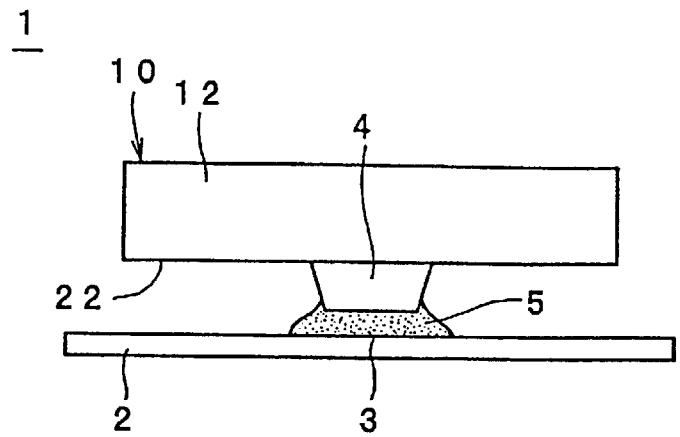
FIG. 24 shows a state after the piezoelectric resonator of the piezoelectric component of FIG. 23 has been fixed.
Figure 25:
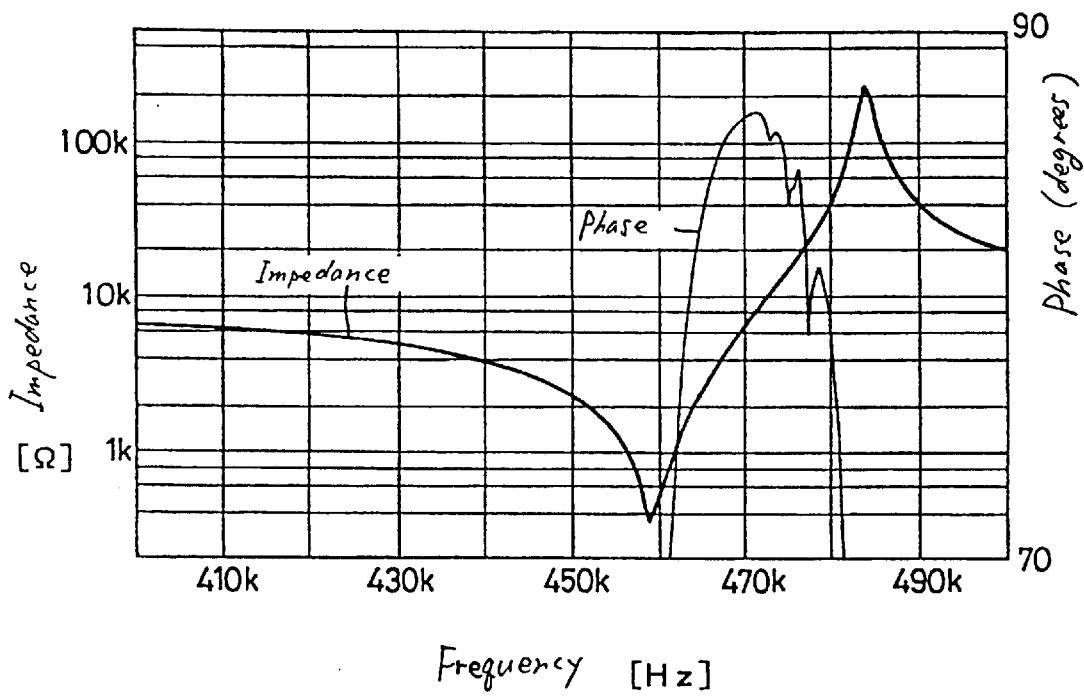
FIG. 25 shows a graph illustrating the impedance characteristics and the phase characteristics of the piezoelectric component shown in FIGS. 23 and 24.
Figure 26:
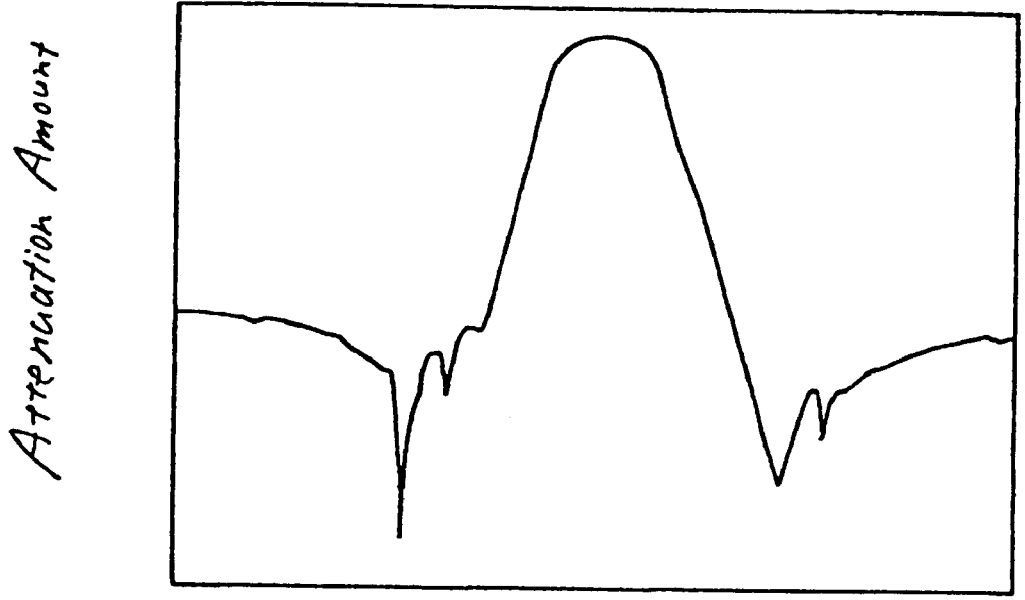
FIG. 26 shows a graph illustrating the filter characteristics of the piezoelectric component shown in FIGS. 23 and 24.

When the temperature changes from 25° C. to –30° C., the center frequency in the piezoelectric component 30 of FIG. 1 increases by about 0.5 kHz, whereas the center frequency in the piezoelectric component 1 in FIGS. 23 and 24 increases by about 1.5 kHz. Accordingly, compared to the piezoelectric component 1 of FIGS. 23 and 24, the piezoelectric component 30 of FIG. 1 provides excellent temperature characteristics.

Figure 7:
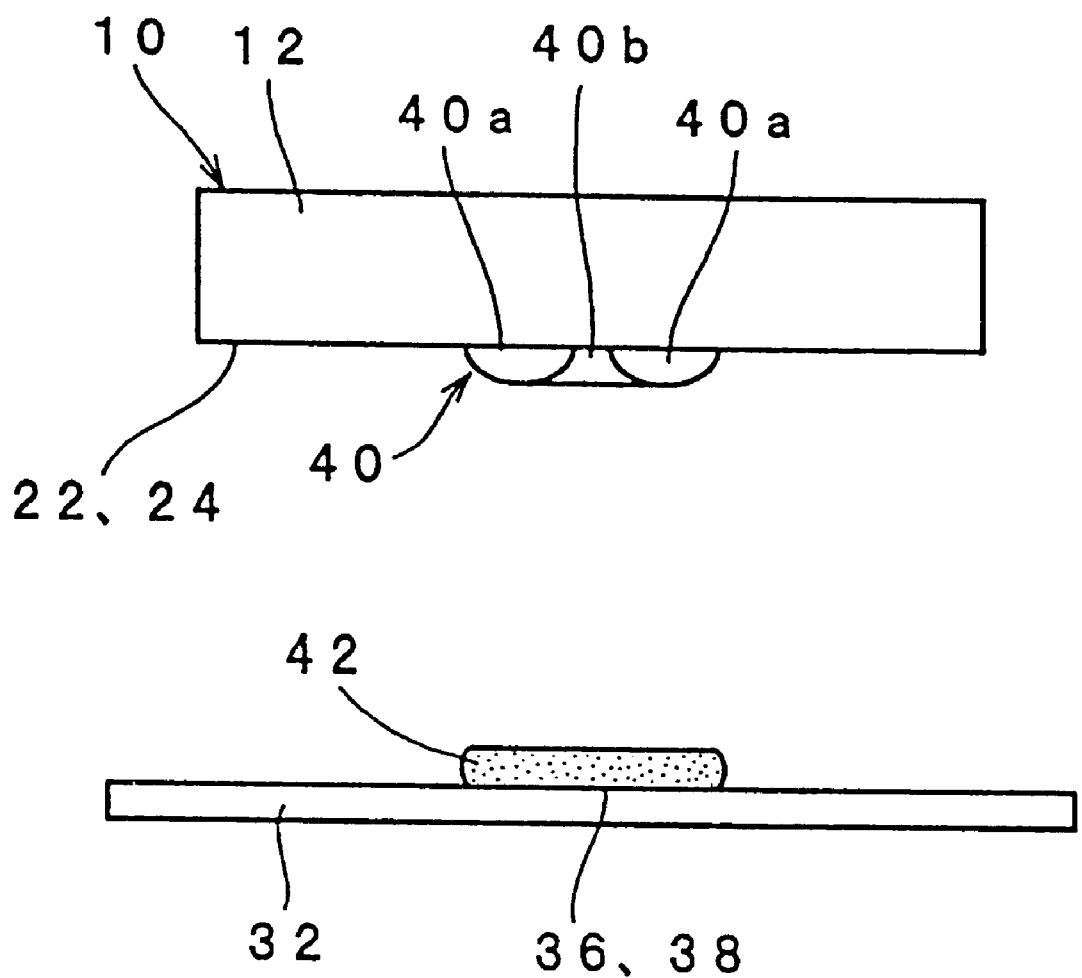
FIG. 7 shows a modification of the piezoelectric component of FIG. 1.

FIG. 7 illustrates a modification of the piezoelectric component shown in FIG. 1. The piezoelectric component 30 shown in FIG. 7 differs from the piezoelectric component 30 shown in FIG. 1 in that other portions 40b on outside portions 40a of each fixing member 40 are formed thin portions that have a thickness which is about the same as that of the outside portions 40a of each fixing member 40. Therefore, compared to the piezoelectric component 30 shown in FIG. 1, the piezoelectric component 30 shown in FIG. 7 can be made thinner.

Figure 8:
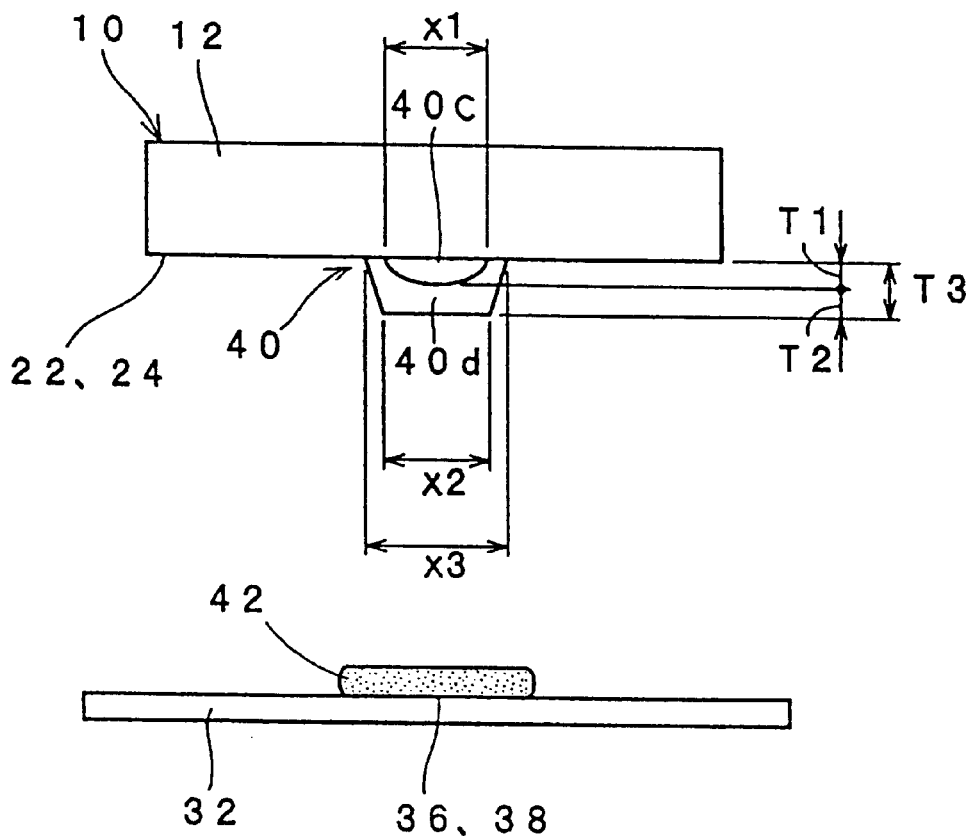
FIG. 8 shows a state before a piezoelectric resonator of another preferred embodiment of the piezoelectric component in accordance with the present invention is fixed.
Figure 9:
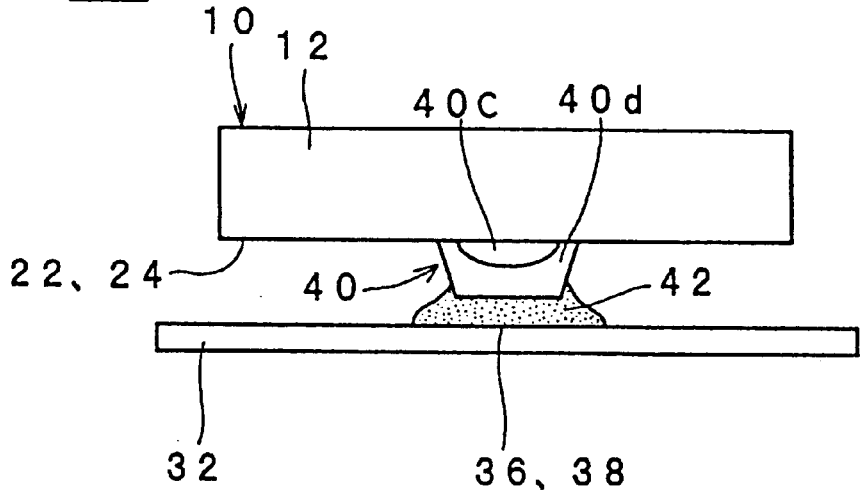
FIG. 9 shows a state after the piezoelectric resonator of the piezoelectric component of FIG. 8 has been fixed.

FIG. 8 illustrates a state before the piezoelectric resonator of another preferred embodiment of the piezoelectric component in accordance with the present invention is fixed. FIG. 9 illustrates a state after the piezoelectric resonator of the piezoelectric component has been fixed.

The piezoelectric component 30 shown in FIGS. 8 and 9 differs from the piezoelectric component 30 of FIG. 1 in that inside portions 40c of fixing members 40 that are portions which contact external electrodes 22 and 24 and that are located at approximate center portions, in a longitudinal direction of the piezoelectric resonator 10, of the piezoelectric resonator 10 are preferably made of a vibration transmission restricting material, such as urethane or silicone, to restrict the transmission of vibration from the piezoelectric resonator 10 to the base 32 through the fixing members 40. It also differs in that other portions 40d on the inside portions 40c are preferably made of a urethane-type electrically conductive material, that is, urethane-type synthetic resin including about 85 wt % of Ag.

The dimension x1 of the inside portion 40c of each fixing member 40 in the longitudinal direction of the piezoelectric resonator 10 is not more than about 80% of dimension x3 of the upper portion of each fixing member 40. However, the dimension X1 may have other values.

The dimension x2 of the lower portion of each fixing member 40 in the longitudinal direction of the piezoelectric resonator 10 is, for example, equal to or greater than about 0.5 mm, but may have other values.

The dimension x3 of the upper portion of each fixing member 40 in the longitudinal direction of the piezoelectric resonator 10 is preferably equal to or less than about 1.5 mm, depending on the type of mounting jig used. However, the dimension X3 may have other values.

The thickness T1 of the inside portion 40c of each fixing member 40 is, for example, about 20 $\mu$m, but may have other values.

The difference T2 between the thickness of the other portions 40d on the inside portions 40c and the thickness of the respective inside portions 40c of the fixing members 40 is equal to or greater than about 0 mm.

The thickness T3 of each fixing member 40 is, for example, about 200 $\mu$m, but may have other values.

The piezoelectric component 30 shown in FIGS. 8 and 9 achieves advantages similar to those of the piezoelectric component 30 shown in FIG. 1.

Figure 10:
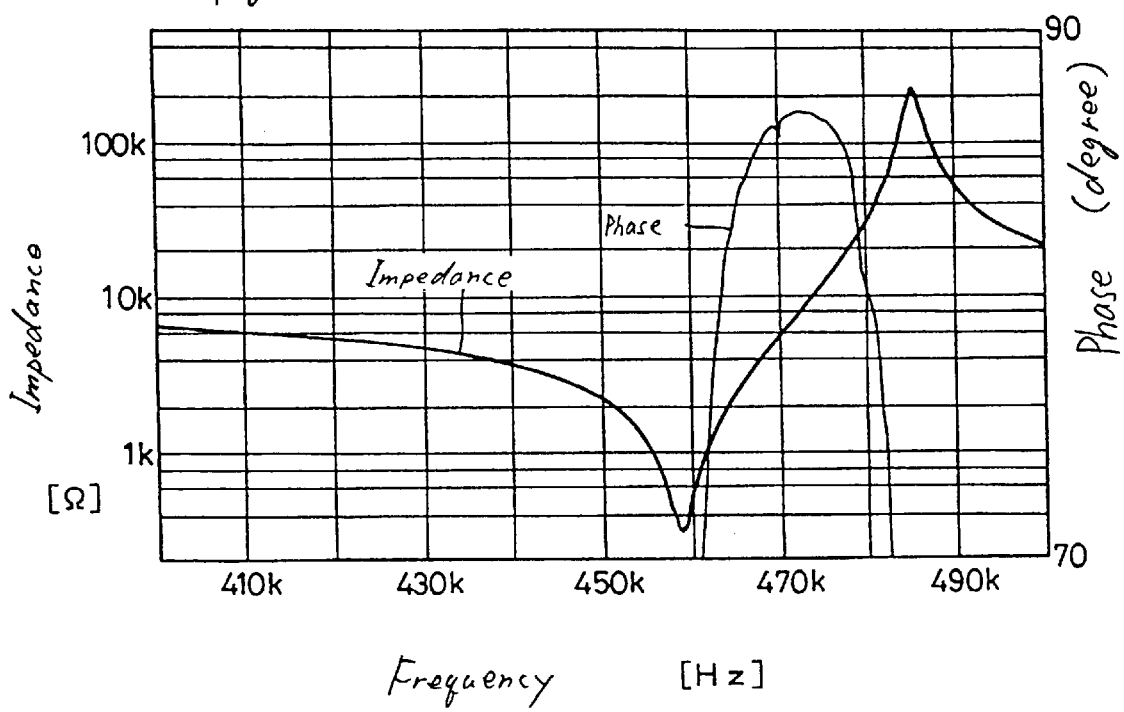
FIG. 10 shows a graph illustrating the impedance characteristics and the phase characteristics of the piezoelectric component shown in FIGS. 8 and 9.

The piezoelectric component 30 shown in FIGS. 8 and 9 possess the impedance characteristics and the phase characteristics illustrated in FIG. 10. From, for example, the impedance characteristics and the phase characteristics shown in FIG. 10, it can be seen than the amount of noise produced by the piezoelectric component 30 of FIGS. 8 and 9 is much smaller than that produced by the piezoelectric component 1 shown in FIGS. 23 and 24. It can be seen that the noise produced by the piezoelectric component 30 of FIG. 1 is much smaller than that produced by the piezoelectric component 30 of FIGS. 8 and 9.

The center portions of the piezoelectric resonator 10 in the longitudinal direction thereof define nodal points and displacement increases as the distance from the center portions increases, so that the portions of the fixing members 40 of the piezoelectric component 30 of FIG. 1 made of a vibration transmission restricting material are located towards the outer sides of the piezoelectric resonator 10 in the longitudinal direction thereof compared to those of the fixing members 40 of the piezoelectric component 30 shown in FIGS. 8 and 9. This is very effective in restricting the transmission of vibration from the piezoelectric resonator 10 to the base 32 through the fixing members 40.

Figure 11:
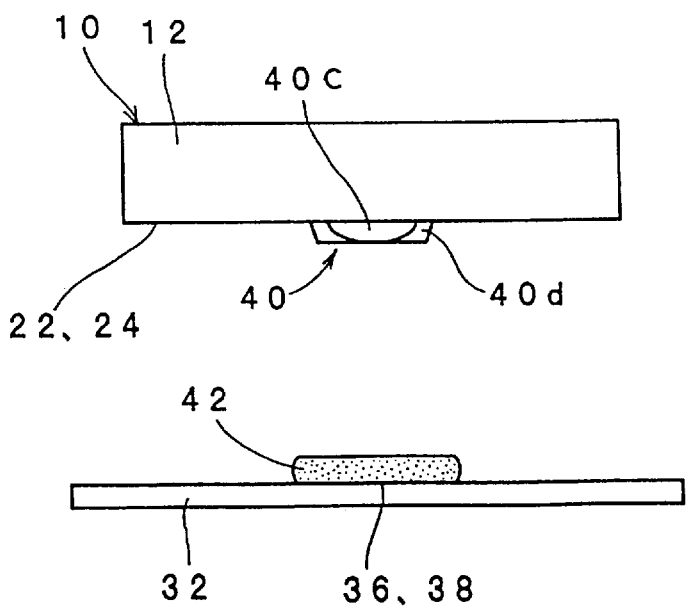
FIG. 11 shows a modification of the piezoelectric component shown in FIGS. 8 and 9.

FIG. 11 illustrates a modification of the piezoelectric component of FIGS. 8 and 9. The piezoelectric component 30 of FIG. 11 differs from the piezoelectric component 30 shown in FIGS. 8 and 9 in that other portion 40d on an inside portion 40c of each fixing member 40 has a thickness which is the same as that of its corresponding inside portion 40c. The piezoelectric component 30 of FIG. 11 can be made thinner than the piezoelectric component 30 of FIGS. 8 and 9.

Figure 12:
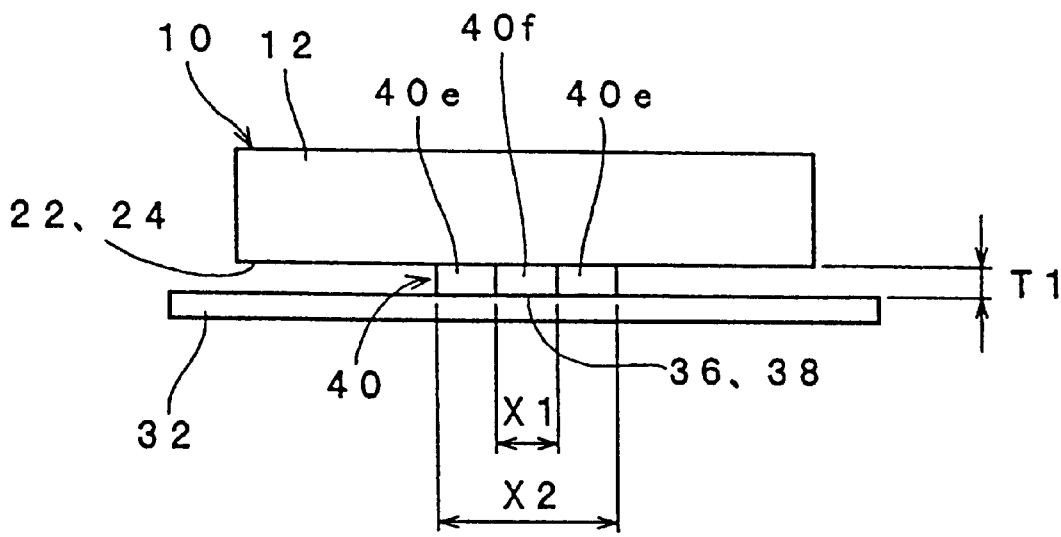
FIG. 12 shows still another preferred embodiment of the piezoelectric component in accordance with the present invention.

FIG. 12 shows still another preferred embodiment of the piezoelectric component in accordance with the present invention. The piezoelectric component 30 of FIG. 12 differs from the piezoelectric component 30 of FIG. 1 in that both outside portions 40e of each fixing member 40 that are portions which contact external electrodes 22 and 24 and pattern electrodes 36 and 38 and that are arranged to extend in a longitudinal direction of a piezoelectric resonator 10 are preferably made of a vibration transmission restricting material, such as urethane or silicone, to restrict the transmission of vibration from the piezoelectric resonator 10 to the base 32 through each fixing member 40. The remaining inside portion 40f of each fixing member 40 is preferably made of an epoxy-type electrically conductive material, that is, epoxy-type synthetic resin containing Ag or other suitable material.

The dimension X1 between the outside portions 40e of each fixing member 40 in the longitudinal direction of the piezoelectric resonator 10 is, for example, about 0.3 mm to about 0.5 mm (which is about 7.5% to about 12.5% of the length of the piezoelectric resonator 10), or equal to or less than about 1.0 mm (which is equal to or less than about 25% of the length of the piezoelectric resonator 10). The dimension X1 may have other values. The lower limit of the dimension X1 is determined by the electrical conductivity between the external electrodes 22 and 24 and the pattern electrodes 36 and 38.

The dimension X2 of each fixing member 40 in the longitudinal direction of the piezoelectric resonator 10 is greater than the dimension X1. From the point of view of strength, the dimension X2 is, for example, equal to or greater than about 0.8 mm (which is equal to or greater than about 20% of the length of the piezoelectric resonator 10). The dimension X2 may have other values.

The thickness T1 of each fixing member 40 is about 20 μm to about 100 μm, but may have other values.

The two fixing members 40 are bonded at their inside portions 40f, preferably made of an epoxy-type electrically conductive material, to the two pattern electrodes 36 and 38 on the base 32.

The piezoelectric component 30 of FIG. 12 achieves advantages similar to those of the piezoelectric component 30 of FIG. 1, and can be made thin.

In producing the piezoelectric component 30 of FIG. 12, the step of printing an electrically conductive paste after the formation of the fixing members 40 is not required, so that the problem of variations in the characteristics thereof caused by electrically conductive paste moving onto the fixing members 40 and the problem of reduced effectiveness in restricting the transmission of vibration almost never occur.

Figure 13:
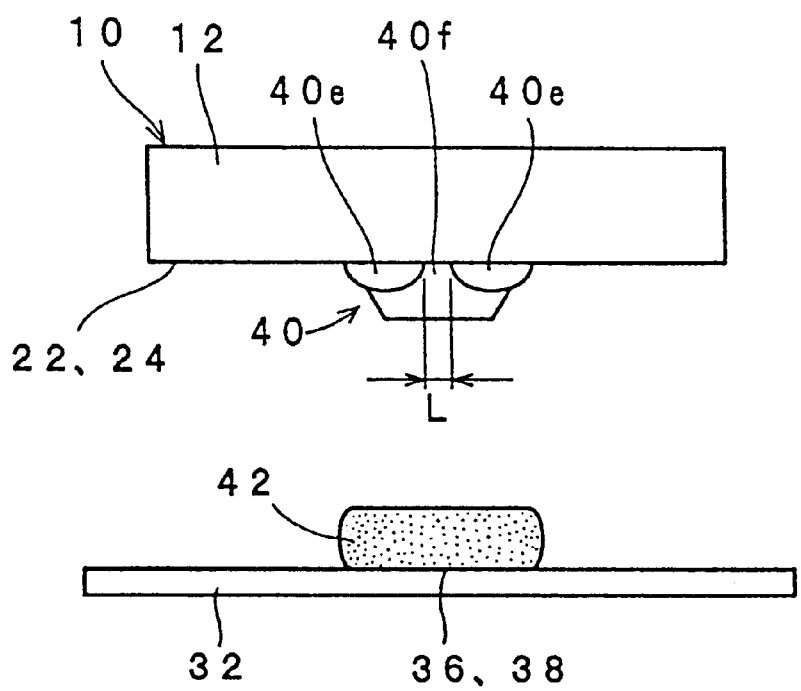
FIG. 13 shows a state before the piezoelectric resonator of a modification of the piezoelectric component of FIG. 12 is fixed.
Figure 14:
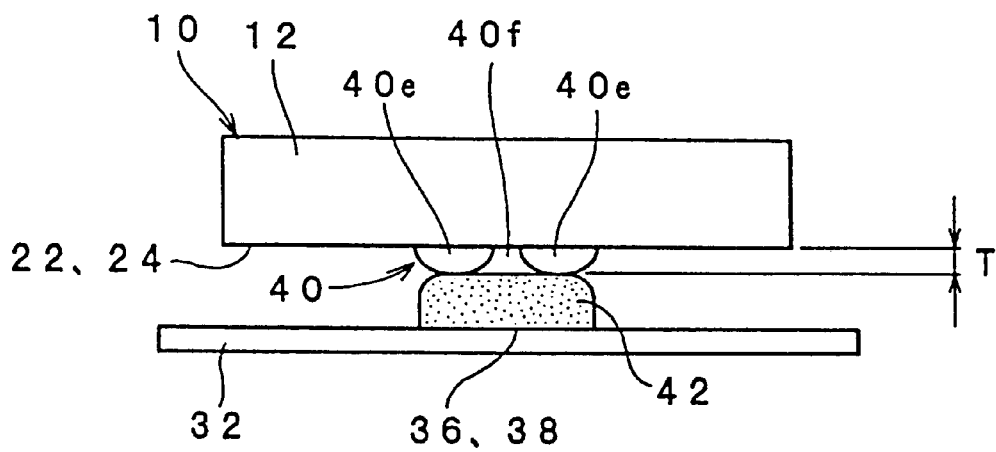
FIG. 14 shows a state after the piezoelectric resonator of the piezoelectric component of FIG. 13 has been fixed.

FIG. 13 illustrates a state before the piezoelectric resonator used in a modification of the piezoelectric component of FIG. 12 is fixed. FIG. 14 shows a state after the piezoelectric resonator used in the modified piezoelectric component of FIG. 13 has been fixed. The piezoelectric component 30 shown in FIGS. 13 and 14 differs from the piezoelectric component 30 of FIG. 12 in that an inside portion 40f of each fixing member 40 is preferably made of a urethane-type electrically conductive material containing Ag, that is, urethane-type synthetic resin containing Ag and has a thickness that is greater than the thickness of outside portions 40e made of a vibration transmission restricting material so as to cover the outside portions 40e. Using an electrically conductive paste 42 including an epoxy-type electrically conductive material, the fixing members 40 are bonded to two electrode patterns 36 and 38 so that the inside portions 40f of the fixing members 40 are bonded therewith.

In this case, thickness T between the electrically conductive paste 42 and the external electrode 22 and the external electrode 24 of the piezoelectric resonator 10 is, for example, in the range of about 50 μm, which is about the same as the thickness of the outside portions 40e of the fixing members 40.

The thickness of the electrically conductive paste 42 is preferably, for example, about 80 μm.

The piezoelectric component 30 shown in FIGS. 13 and 14 achieves advantages similar to those achieved by the piezoelectric component 30 of FIG. 12.

Figure 15:
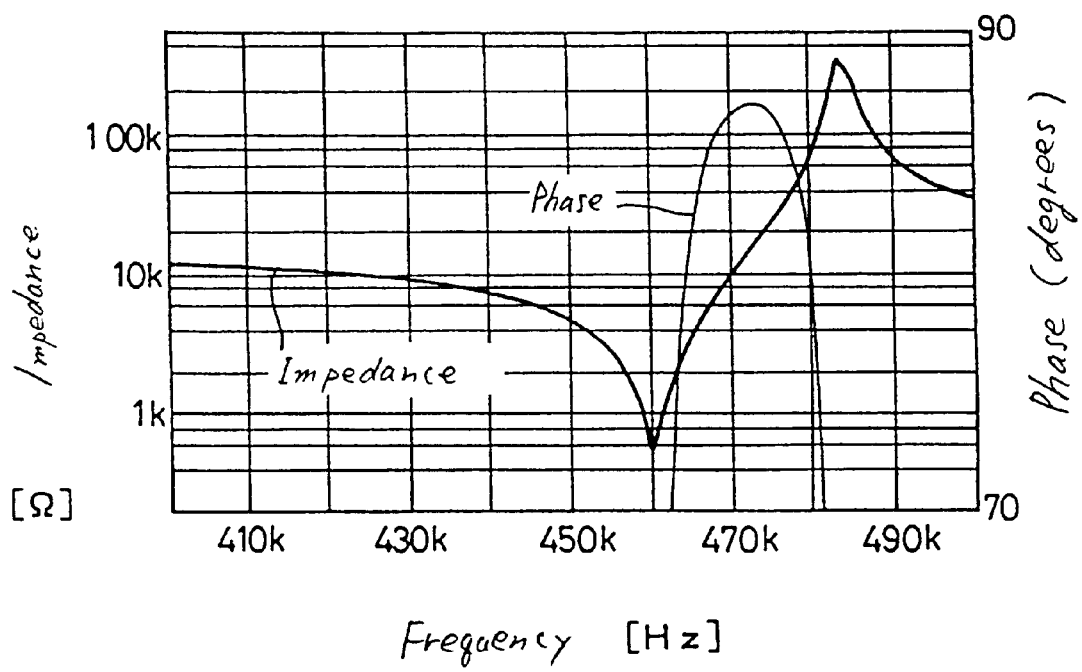
FIG. 15 shows an example of the impedance characteristics and the phase characteristics of the piezoelectric component shown in FIGS. 13 and 14.
Figure 16:
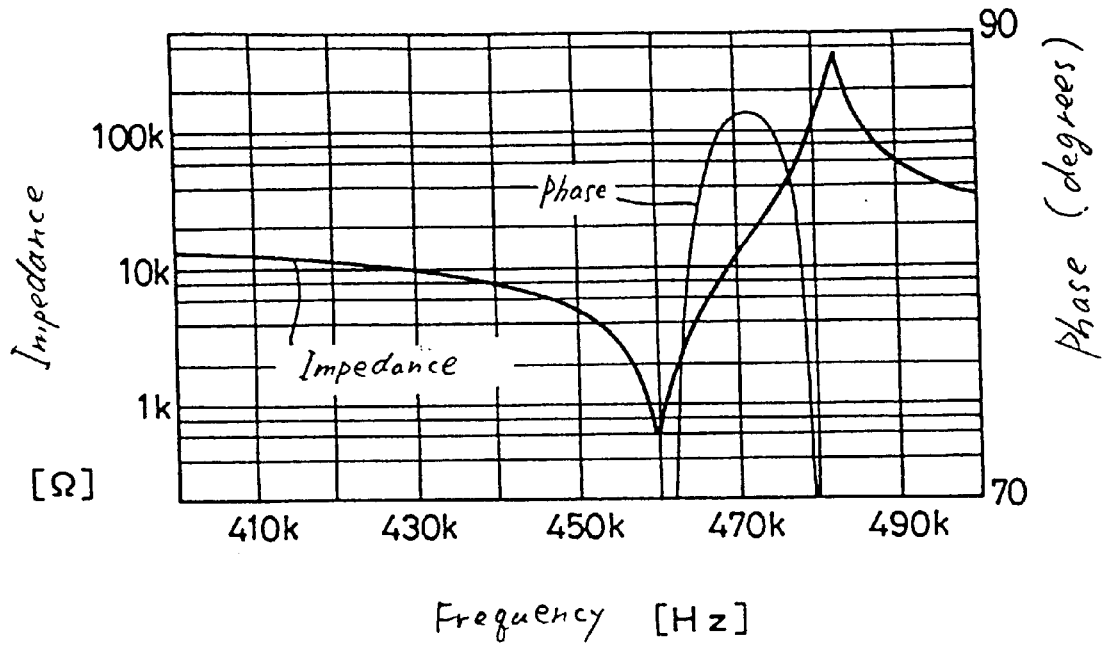
FIG. 16 shows another example of the impedance characteristics and the phase characteristics of the piezoelectric component shown in FIGS. 13 and 14.

FIG. 15 shows the impedance characteristics and the phase characteristics that the piezoelectric component 30 shown in FIGS. 13 and 14 possess, when the dimension L between the outside portions 40e and 40e of each fixing member 40 is about 0.314 mm. FIG. 16 shows the impedance characteristics and the phase characteristics that the piezoelectric component 30 shown in FIGS. 13 and 14 possess, when the dimension L is about 0.316 mm.

Figure 17:
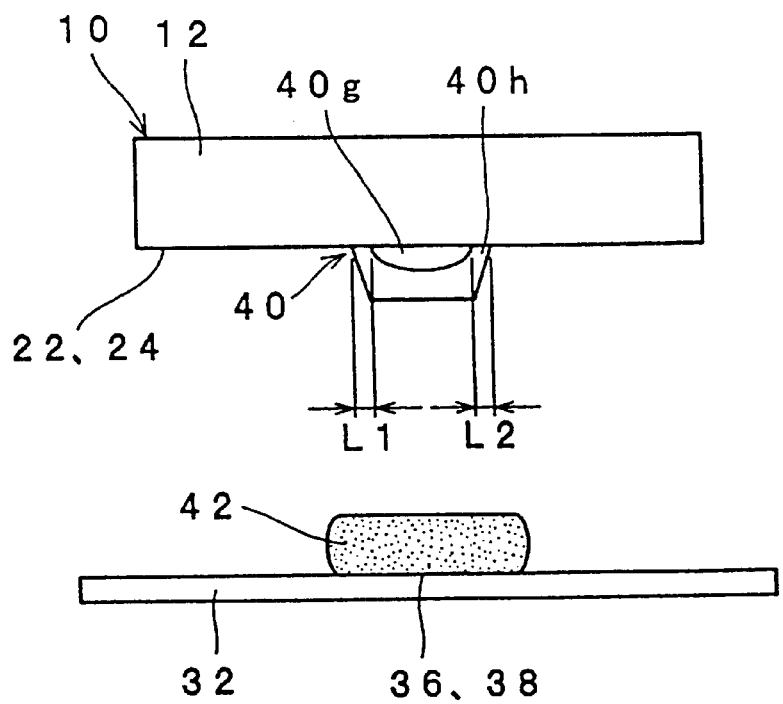
FIG. 17 shows a state before a piezoelectric resonator of another modification of the piezoelectric component of FIG. 12 is fixed.
Figure 18:
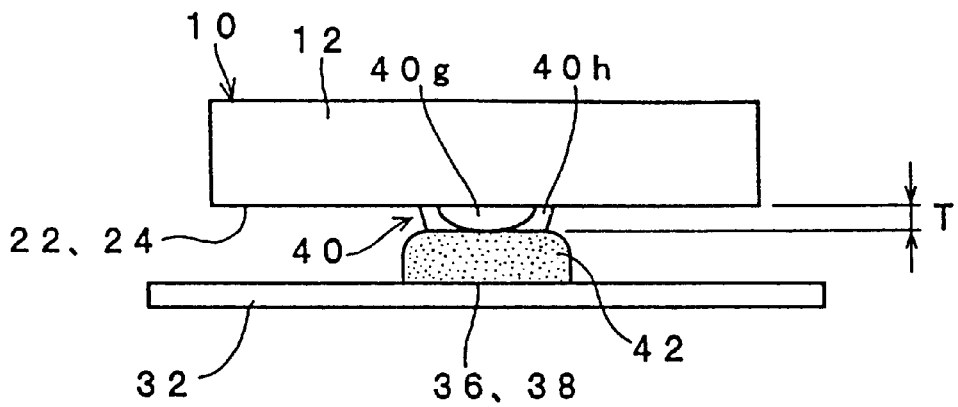
FIG. 18 shows a state after the piezoelectric resonator of the piezoelectric component of FIG. 17 has been fixed.

FIG. 17 illustrates a state before a piezoelectric resonator of another modification of the piezoelectric component of FIG. 12 is fixed. FIG. 18 shows a state after the piezoelectric resonator of the piezoelectric component of FIG. 17 has been fixed. In the piezoelectric component 30 shown in FIGS. 17 and 18, an inside portion 40g of each fixing member 40 is preferably made of a vibration transmission restricting material, such as urethane or silicone, and an outside portion 40h of each fixing member 40 is preferably made of a urethane-type electrically conductive material, that is, a urethane-type synthetic resin including about 85 wt % of Ag so as to cover the inside portion 40g of each fixing member 40. The fixing members 40 are bonded to two electrode patterns 36 and 38 preferably via an electrically conductive paste 42 made of an epoxy-type electrically conductive material or an epoxy-type synthetic resin containing Ag and arranged so as to cover the outside portion 40h of each fixing member 40.

In this case, thickness T between the electrically conductive paste 42 and external electrodes 22 and 24 of the piezoelectric resonator 10 is, for example, in the range of about 50 μm, which is about the thickness of the inside portions 40g of the fixing members 40.

The thickness of the electrically conductive paste 42 is, for example, about 80 μm.

The piezoelectric component 30 shown in FIGS. 17 and 18 achieves advantages similar to those achieved by the piezoelectric component 30 of FIG. 12.

Figure 19:
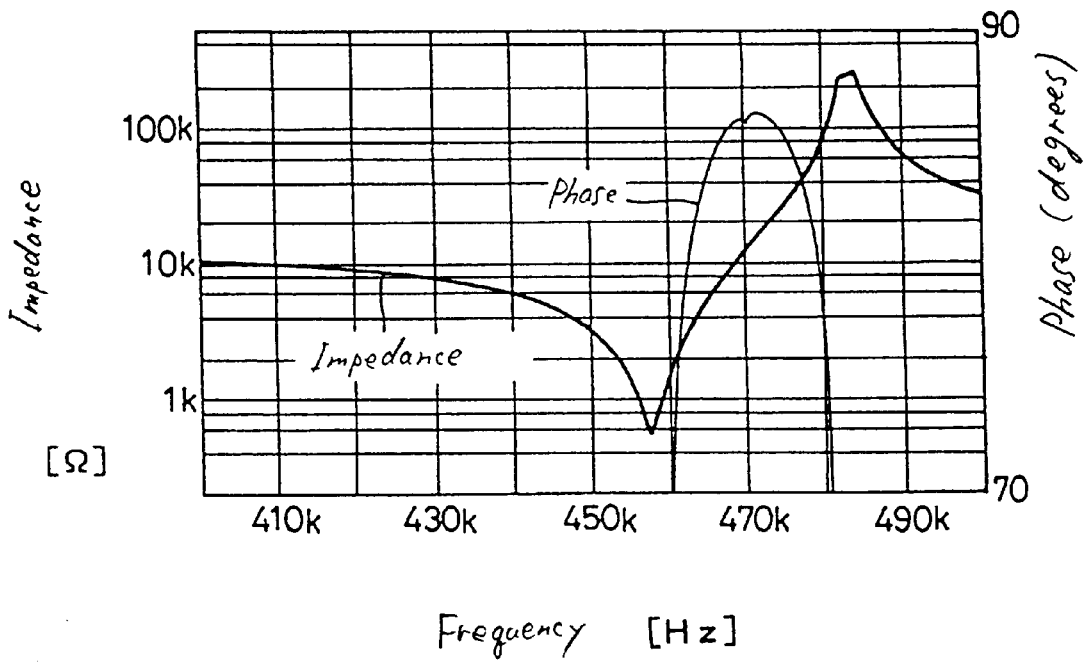
FIG. 19 shows an example of the impedance characteristics and the phase characteristics of the piezoelectric component shown in FIGS. 17 and 18.
Figure 20:
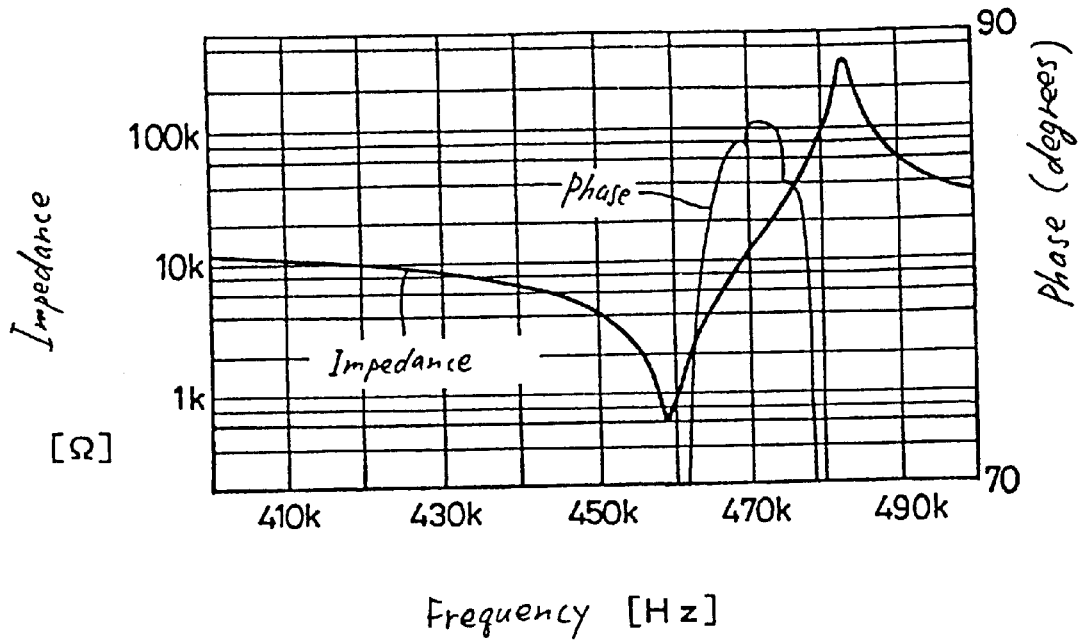
FIG. 20 shows another example of the impedance characteristics and the phase characteristics of the piezoelectric component shown in FIGS. 17 and 18.

FIG. 19 shows the impedance characteristics and the phase characteristics achieved by the piezoelectric component 30 shown in FIGS. 17 and 18, when the dimension (L1+L2) of the outside portion 40h at the upper portion of each fixing member 40 in the longitudinal direction of the piezoelectric resonator 10 is about 0.309 mm. FIG. 20 shows the impedance characteristics and the phase characteristics achieved by the piezoelectric component 30, when the dimension (L1+L2) is about 0.322 mm.

From the impedance characteristics and the phase characteristics illustrated in FIGS. 15, 16, 19 and 20, it can be seen that the piezoelectric component 30 shown in FIGS. 13 and 14 generates a smaller amount of noise than the piezoelectric component 30 shown in FIGS. 17 and 18.

Although in the above-described piezoelectric components 30, a piezoelectric resonator 10 having a special structure, shown in FIG. 21, is used, a differently structured piezoelectric resonator such as a single, plate-shaped piezoelectric resonator may also be used.

Although each of the portions of each of the above-described piezoelectric components 30 preferably has special dimensions and forms, it may be formed with other dimensions and forms.

Although in each of the above-described piezoelectric components 30, special materials are used for the materials of the fixing members 40 and the electrically conductive pastes 42, other materials may be used.

While the invention has been particularly shown and described with reference to preferred embodiments thereof, it will be understood by those skilled in the art that the forgoing and other changes in form and details may be made therein without departing from the spirit of the invention.

What is claimed is:

1. A piezoelectric resonator apparatus comprising:
   a piezoelectric resonator;
   a supporting structure arranged to support the piezoelectric resonator thereon;
   a fixing member disposed between the piezoelectric resonator and the supporting structure and arranged to secure the piezoelectric resonator on the supporting structure; wherein
   a portion of the fixing member that contacts the piezoelectric resonator is made of an electrically nonconductive vibration transmission restricting material for restricting transmission of vibration of the piezoelectric resonator to the supporting structure through the fixing member.

2. The piezoelectric resonator apparatus according to claim 1, wherein the piezoelectric resonator is constructred to vibrate in a longitudinal vibration mode.

3. The piezoelectric resonator apparatus according to claim 1, wherein the portion made of the electrically nonconductive vibration transmission restricting material is an outer portion of the fixing member.

4. The piezoelectric resonator apparatus according to claim 1, wherein the portion made of the electrically nonconductive vibration transmission restricting material is an inner portion of the fixing member.

5. The piezoelectric resonator apparatus according to claim 1, wherein a portion of the fixing member that extends from the portion of the fixing member that contacts the piezoelectric resonator to a portion of the fixing member located at a side of the supporting structure is made of the vibration transmission restricting material.

6. The piezoelectric resonator apparatus according to claim 1, wherein the vibration transmission restricting material includes at least one of urethane and silicone.

7. The piezoelectric resonator apparatus according to claim 1, wherein the supporting structure is a base and a cover is provided on the base so as to cover the piezoelectric resonator.

8. The piezoelectric resonator apparatus according to claim 7, further comprising a plurality of the piezoelectric resonators.

9. The piezoelectric resonator apparatus according to claim 1, wherein two recesses each are formed on opposite edges of the supporting structure and two pattern electrodes are provided on one surface of the supporting structure.

10. The piezoelectric resonator apparatus according to claim 1, wherein the piezoelectric resonator is fixed at the approximate center portion of the support structure through the fixing member.

11. The piezoelectric resonator apparatus according to claim 1, wherein the piezoelectric resonator includes external electrodes and there are two of the fixing members disposed approximate center portions of the external electrodes of the piezoelectric resonator.

12. The piezoelectric resonator apparatus according to claim 1, wherein portions of the fixing member other than the portion made of the electrically nonconductive vibration transmission restricting material are made of a urethane-type electrically conductive material.

13. The piezoelectric resonator apparatus according to claim 12, wherein the urethane-type electrically conductive material includes one of a urethane-type synthetic resin containing about 85 wt % of Ag and a urethane-type synthetic resin containing from about 80 wt % to not more than about 85 wt % of Ag.

14. The piezoelectric resonator apparatus according to claim 1, further comprising a plurality of fixing members, and a dimension X1 between the outside portions of each of the fixing members in the longitudinal direction of the piezoelectric resonator is between about 0.3 mm to about 1.0 mm.

15. The piezoelectric resonator apparatus according to claim 1, further comprising a plurality of fixing members, and wherein a dimension X2 of the lower portion of each of the fixing members in the longitudinal direction of the piezoelectric resonator is equal to or greater than about 0.5 mm.

16. The piezoelectric resonator apparatus according to claim 1, further comprising a plurality of fixing members, and wherein a dimension X3 of the upper portion of each of the fixing members in the longitudinal direction of the piezoelectric resonator is equal to or less than about 1.5 mm.

17. The piezoelectric resonator apparatus according to claim 1, further comprising a plurality of fixing members, and wherein a thickness T3 of each of the fixing members 40 is about 200 $\mu$m.

18. The piezoelectric resonator apparatus according to claim 1, further comprising a plurality of fixing members, and wherein the piezoelectric resonator includes external electrodes and the support structure includes pattern electrodes, and the fixing members are bonded to pattern electrodes on the support structure via electrically conductive pastes made of an epoxy-type electrically conductive material.

19. The piezoelectric resonator apparatus according to claim 18, wherein the external electrodes of the piezoelectric resonator are electrically connected to the pattern electrodes on the support structure via the fixing members.

20. A piezoelectric resonator apparatus comprising:
   at least one piezoelectric resonator;
   a supporting structure having the piezoelectric resonator mounted thereon;

a fixing member disposed between the piezoelectric resonator and the supporting structure and arranged to secure the piezoelectric resonator on the supporting structure; wherein a portion of the fixing member that contacts the piezoelectric resonator is made of an electrically non-conductive vibration transmission restricting material for restricting transmission of vibration from the piezoelectric resonator to the supporting structure through the fixing member and another portion of the fixing member other than the portion made of the non-conductive vibration transmission restricting material is made of a urethane-type electrically conductive material.

* * * * *